(12) United States Patent
Ryu et al.

(10) Patent No.: US 9,704,747 B2
(45) Date of Patent: Jul. 11, 2017

(54) SEMICONDUCTOR DEVICE AND MANUFACTURING METHOD THEREOF

(71) Applicant: Amkor Technology, Inc., Chandler, AZ (US)

(72) Inventors: Ji Yeon Ryu, Seongnam-si (KR); Byong Jin Kim, Bucheon-si (KR); Jae Beum Shim, Incheon (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/218,292

(22) Filed: Mar. 18, 2014

(65) Prior Publication Data
US 2014/0291844 A1     Oct. 2, 2014

(30) Foreign Application Priority Data

Mar. 29, 2013 (KR) .......................... 10-2013-0034493

(51) Int. Cl.
*H01L 23/48* (2006.01)
*H01L 21/78* (2006.01)
(Continued)

(52) U.S. Cl.
CPC .......... *H01L 21/78* (2013.01); *H01L 21/4846* (2013.01); *H01L 21/561* (2013.01);
(Continued)

(58) Field of Classification Search
CPC ..... H01L 2224/12105; H01L 23/49816; H01L 2924/18162; H01L 23/5389;
(Continued)

(56) References Cited

U.S. PATENT DOCUMENTS 3,868,724 A    2/1975  Perrino
3,916,434 A   10/1975  Garboushian
(Continued)

FOREIGN PATENT DOCUMENTS

JP     10-334205 A    12/1998
JP     2001118947 A   10/1999
(Continued)

OTHER PUBLICATIONS

Fillion et al., "CAD/CIM Requirements in Support of Plastic Encapsulated MCM Technology for High Volume, Low Cost Electronics" GE Corporate Research and Development, Advancing Microelectronics—Sep./Oct. 1994 (7 pages).
(Continued)

*Primary Examiner* — Khiem D Nguyen
(74) *Attorney, Agent, or Firm* — McAndrews, Held & Malloy, Ltd.

(57) ABSTRACT

Provided are a semiconductor device having a stably formed structure capable of being electrically connected to a second electronic device without causing damage to the semiconductor device, and a manufacturing method thereof. In one embodiment, the semiconductor device may comprise a semiconductor die, an encapsulation part formed on lateral surfaces of the semiconductor die, a dielectric layer formed on the semiconductor die and the encapsulation part, a redistribution layer passing through a part of the dielectric layer and electrically connected to the semiconductor die, a plurality of conductive balls extending through other parts of the dielectric layer and electrically connected to the redistribution layer where the conductive balls are exposed to an environment outside of the semiconductor device, and conductive vias extending through the encapsulation part and electrically connected to the redistribution layer.

17 Claims, 7 Drawing Sheets

(51) Int. Cl.
*H01L 21/56* (2006.01)
*H01L 23/00* (2006.01)
*H01L 23/498* (2006.01)
*H01L 21/48* (2006.01)
*H01L 23/538* (2006.01)

(52) U.S. Cl.
CPC ...... *H01L 21/568* (2013.01); *H01L 23/49811* (2013.01); *H01L 23/49816* (2013.01); *H01L 23/49822* (2013.01); *H01L 23/49894* (2013.01); *H01L 23/5389* (2013.01); *H01L 24/19* (2013.01); *H01L 24/96* (2013.01); *H01L 24/97* (2013.01); *H01L 2224/0401* (2013.01); *H01L 2224/04105* (2013.01); *H01L 2224/12105* (2013.01); *H01L 2924/12042* (2013.01); *H01L 2924/181* (2013.01); *H01L 2924/18162* (2013.01)

(58) Field of Classification Search
CPC . H01L 23/49894; H01L 21/78; H01L 21/568; H01L 24/19; H01L 24/96; H01L 24/97; H01L 23/49811; H01L 21/561; H01L 23/49822; H01L 21/76897; H01L 21/56; H01L 23/3114; H01L 23/3121
See application file for complete search history.

(56) References Cited

U.S. PATENT DOCUMENTS

| | | |
|---|---|---|
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,841,193 A | 11/1998 | Eichelberger |
| 5,847,453 A | 12/1998 | Uematsu et al. |
| 5,883,425 A | 3/1999 | Kobayashi |
| 5,894,108 A | 4/1999 | Mostafazadeh et al. |
| 5,898,219 A | 4/1999 | Barrow |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,159,767 A | 12/2000 | Eichelberger |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,316,285 B1 | 11/2001 | Jiang et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,486,005 B1 | 11/2002 | Kim |
| 6,489,676 B2 | 12/2002 | Taniguchi et al. |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,586,682 B2 | 7/2003 | Strandberg |
| 6,608,757 B1 | 8/2003 | Bhatt et al. |
| 6,625,880 B2 | 9/2003 | Nabemoto et al. |
| 6,631,558 B2 | 10/2003 | Burgess |
| 6,660,559 B1 | 12/2003 | Huemoeller et al. |
| 6,714,418 B2 | 3/2004 | Frankowsky et al. |
| 6,715,204 B1 | 4/2004 | Tsukada et al. |

(56) References Cited

U.S. PATENT DOCUMENTS

| | | | |
|---|---|---|---|
| 6,727,576 B2 | 4/2004 | Hedler |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,845,554 B2 | 1/2005 | Frankowsky et al. |
| 6,888,240 B2 | 5/2005 | Towle et al. |
| 6,905,914 B1 | 6/2005 | Huemoeller et al. |
| 6,919,514 B2 | 7/2005 | Konrad et al. |
| 6,921,968 B2 | 7/2005 | Chung |
| 6,921,975 B2 | 7/2005 | Leal et al. |
| 6,930,256 B1 | 8/2005 | Huoemoeller et al. |
| 6,931,726 B2 | 8/2005 | Boyko et al. |
| 6,946,325 B2 | 9/2005 | Yean et al. |
| 6,953,995 B2 | 10/2005 | Farnworth et al. |
| 6,963,141 B2 | 11/2005 | Lee et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,084,513 B2 | 8/2006 | Matsuki et al. |
| 7,087,514 B2 | 8/2006 | Shizuno |
| 7,125,744 B2 | 10/2006 | Takehara et al. |
| 7,185,426 B1 | 3/2007 | Hiner et al. |
| 7,189,593 B2 | 3/2007 | Lee |
| 7,192,807 B1 | 3/2007 | Huemoeller et al. |
| 7,196,408 B2 | 3/2007 | Yang et al. |
| 7,202,107 B2 | 4/2007 | Fuergut et al. |
| 7,238,602 B2 | 7/2007 | Yang |
| 7,242,081 B1 | 7/2007 | Lee |
| 7,247,523 B1 | 7/2007 | Huemoeller et al. |
| 7,262,081 B2 | 8/2007 | Yang et al. |
| 7,276,799 B2 | 10/2007 | Lee et al. |
| 7,282,394 B2 | 10/2007 | Cho et al. |
| 7,285,855 B2 | 10/2007 | Foong |
| 7,326,592 B2 | 2/2008 | Meyer et al. |
| 7,339,279 B2 | 3/2008 | Yang |
| 7,345,361 B2 | 3/2008 | Mallik et al. |
| 7,361,987 B2 | 4/2008 | Leal |
| 7,372,151 B1 | 5/2008 | Fan et al. |
| 7,405,102 B2 | 7/2008 | Lee et al. |
| 7,420,272 B1 | 9/2008 | Huemoeller et al. |
| 7,420,809 B2 | 9/2008 | Lim et al. |
| 7,429,786 B2 | 9/2008 | Karnezos et al. |
| 7,459,202 B2 | 12/2008 | Magera et al. |
| 7,459,781 B2 | 12/2008 | Yang et al. |
| 7,548,430 B1 | 6/2009 | Huemoeller et al. |
| 7,550,857 B1 | 6/2009 | Longo et al. |
| 7,623,733 B2 | 11/2009 | Hirosawa |
| 7,633,765 B1 | 12/2009 | Scanlan et al. |
| 7,671,457 B1 | 3/2010 | Hiner et al. |
| 7,777,351 B1 | 8/2010 | Berry et al. |
| 7,825,520 B1 | 11/2010 | Longo et al. |
| 7,858,440 B2 | 12/2010 | Pressel et al. |
| 7,859,085 B2 | 12/2010 | Pagaila et al. |
| 7,884,464 B2 | 2/2011 | Yew et al. |
| 7,960,827 B1 | 6/2011 | Miller, Jr. et al. |
| 8,018,068 B1 | 9/2011 | Scanlan et al. |
| 8,026,587 B1 | 9/2011 | Hiner et al. |
| 8,110,909 B1 | 2/2012 | Hiner et al. |
| 8,143,099 B2 | 3/2012 | Park et al. |
| 8,227,338 B1 | 7/2012 | Scanlan et al. |
| 8,341,835 B1 | 1/2013 | Huemoeller et al. |
| 8,552,556 B1 | 10/2013 | Kim et al. |
| 8,629,546 B1 | 1/2014 | Scanlan |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0195697 A1 | 12/2002 | Mess et al. |

| | | | |
|---|---|---|---|
| 2003/0022707 A1 | 1/2003 | Namba et al. |
| 2003/0025188 A1 | 2/2003 | Farnworth |
| 2003/0025199 A1 | 2/2003 | Wu et al. |
| 2003/0112610 A1 | 6/2003 | Frankowsky et al. |
| 2003/0128096 A1 | 7/2003 | Mazzochette |
| 2003/0134450 A1 | 7/2003 | Lee |
| 2003/0141582 A1 | 7/2003 | Yang et al. |
| 2003/0197284 A1 | 10/2003 | Khiang et al. |
| 2004/0063246 A1 | 4/2004 | Karnezos |
| 2004/0113260 A1 | 6/2004 | Sunohara et al. |
| 2004/0145044 A1 | 7/2004 | Sugaya et al. |
| 2004/0159462 A1 | 8/2004 | Chung |
| 2005/0046002 A1 | 3/2005 | Lee et al. |
| 2005/0136646 A1 | 6/2005 | Larnerd |
| 2005/0139985 A1 | 6/2005 | Takahashi |
| 2005/0242425 A1 | 11/2005 | Leal et al. |
| 2006/0008944 A1 | 1/2006 | Shizuno |
| 2006/0091561 A1 | 5/2006 | Dangelmaier et al. |
| 2006/0192301 A1 | 8/2006 | Leal et al. |
| 2006/0231950 A1 | 10/2006 | Yoon |
| 2006/0231958 A1 | 10/2006 | Yang |
| 2006/0270108 A1 | 11/2006 | Farnworth et al. |
| 2007/0059866 A1 | 3/2007 | Yang et al. |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2007/0296065 A1* | 12/2007 | Yew .................. H01L 23/5389 257/659 |
| 2008/0105967 A1 | 5/2008 | Yang et al. |
| 2008/0128884 A1 | 6/2008 | Meyer et al. |
| 2008/0142960 A1 | 6/2008 | Leal |
| 2008/0157250 A1 | 7/2008 | Yang et al. |
| 2008/0169548 A1* | 7/2008 | Baek .................. H01L 23/5389 257/686 |
| 2008/0182363 A1 | 7/2008 | Amrine et al. |
| 2008/0230887 A1 | 9/2008 | Sun et al. |
| 2009/0051025 A1 | 2/2009 | Yang et al. |
| 2009/0075428 A1* | 3/2009 | Tang .................. H01L 21/561 438/114 |
| 2011/0204505 A1* | 8/2011 | Pagaila ............. H01L 21/568 257/686 |
| 2011/0221054 A1 | 9/2011 | Lin et al. |
| 2012/0119373 A1 | 5/2012 | Hunt |
| 2012/0153467 A1* | 6/2012 | Chi et al. .................. 257/737 |
| 2012/0161332 A1 | 6/2012 | Chua et al. |
| 2012/0282767 A1 | 11/2012 | Jin et al. |
| 2012/0286407 A1 | 11/2012 | Choi et al. |

FOREIGN PATENT DOCUMENTS

| | | |
|---|---|---|
| JP | 2005109975 A | 4/2005 |
| JP | 2005136323 A | 5/2005 |
| JP | 2007017175 A | 1/2007 |
| JP | 2008190615 A | 8/2008 |
| KR | 2004012028 A | 2/2004 |
| KR | 2010-0057686 A | 5/2010 |
| KR | 2011-0097102 A | 8/2011 |

OTHER PUBLICATIONS

IBM Technical Disclosure Bulletin, "Microstructure Solder Mask by Means of a Laser", vol. 36, Issue 11, p. 589, Nov. 1, 1993.

Kim et al., "Application of Through Mold Via (TMV) as PoP base package", 58th ECTC Proceedings, May 2008, Lake Buena Vista, FL, 6 pages, IEEE.

Scanlan, "Package-onpackage (PoP) with Through-mold Vias", Advanced Packaging, Jan. 2008, 3 pgs., vol. 17, Issue 1, PennWell Corp.

HyperBGA, Endicott Interconnect: Increased Wiring Density and Layer Count for Both Digital and RF Designs, taken from (http://www.i3electronics.com/index.php/top-nav/our-publications/datasheets) on Dec. 12, 2014 (2 pages).

Korean Office Action of the Korean Patent Application No. 10-2013-0034493 (5 pages), (Apr. 22, 2014).

* cited by examiner

SEMICONDUCTOR DEVICE AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2013-0034493, filed on Mar. 29, 2013, the contents of which are hereby incorporated herein by reference, in their entirety.

FIELD

The present disclosure relates to a semiconductor device and manufacturing method thereof.

BACKGROUND

In general, a semiconductor device includes one or more semiconductor die, a circuit board electrically connected to the semiconductor die, an electrical connection member electrically connecting the semiconductor dies and the circuit board to each other, an encapsulation part encapsulating the semiconductor die, the circuit board and the electrical connection member, and solder balls electrically connected to the circuit board to then be connected to an external device.

In the course of forming the connective structure within semiconductor devices, high temperatures may be generated, resulting in damage to elements of the semiconductor device connective structure, thereby leading to an increase in the defect ratio of the resulting semiconductor devices.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

A semiconductor device and manufacturing method thereof, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION

Aspects of the present disclosure relate to a semiconductor device and a manufacturing method thereof. More specifically, representative embodiments of the present disclosure may relate to a semiconductor device and a method of manufacturing such a semiconductor device, where the semiconductor device includes structural elements that reduce damage to the connective structure due to high temperatures generated during manufacture.

Various aspects of the disclosure will be described in more detail with reference to the accompanying drawings. Those skilled in the art will easily realize various aspects of the present disclosure upon reading the present patent application.

It should be noted that the thickness or size of each layer may be exaggerated for clarity in the accompanying drawings, and that like reference numerals may refer to like elements. Additionally, the term "semiconductor die" in this specification includes, for example, a semiconductor chip having an active circuit and/or a passive circuit, a semiconductor wafer, or equivalents thereof.

As utilized herein, the term "exemplary" means serving as a non-limiting example, instance, or illustration. Also, as utilized herein, the term "representative" means serving as a non-limiting example, instance, or illustration.

Hereinafter, examples of embodiments of the disclosure will be described in detail with reference to the accompanying drawings such that they can easily be made and used by those skilled in the art. Like numbers refer to like elements throughout. In addition, when it is said that an element is electrically coupled to another element, it will be understood that these elements may be directly coupled to each other and may be coupled to each other with another element interposed therebetween.

Figure 1:
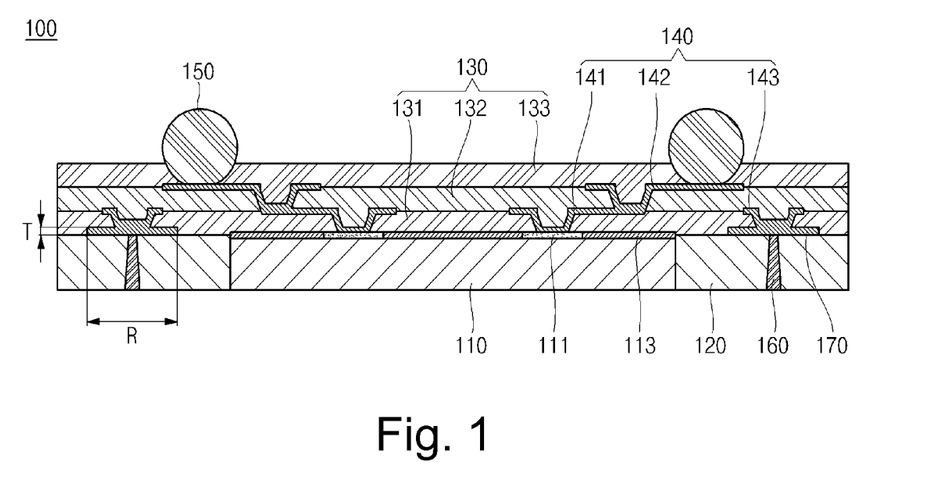
FIG. 1 is a cross-sectional view of a semiconductor device, in accordance with a representative embodiment of the present disclosure.

FIG. 1 is a cross-sectional view of an exemplary semiconductor device 100, in accordance with a representative embodiment of the present disclosure.

Referring now to FIG. 1, the illustrated semiconductor device 100 includes a semiconductor die 110, an encapsulation part 120, a dielectric layer 130, a redistribution layer 140, a plurality of solder balls 150, and conductive vias 160. In addition, the semiconductor device 100 according to a representative embodiment of the present disclosure may further include a buffer layer 170.

In a representative embodiment of the present disclosure, a plurality of metal pads 111 electrically connected to the redistribution layer 140, and a die protection layer 113 for protecting the semiconductor die 110 on regions other than the regions where the metal pads 111 are formed, may be formed on a top surface of the semiconductor die 110. In the illustration of FIG. 1, the metal pads 111 may comprise one or more of, by way of example and not limitation, copper, aluminum, gold, silver, and/or any suitable equivalents thereof, and the die protection layer 113 may, for example, comprise a nitride, or any suitable equivalents thereof.

As shown in FIG. 1, the encapsulation part 120 may be formed on lateral surfaces, that is, outer circumferential surfaces, of the semiconductor die 110, and may be substantially shaped as a plate. In a representative embodiment of the present disclosure, a top surface of the encapsulation part 120 may be coplanar with the top surface of the semiconductor die 110, and the encapsulation part 120 may comprise one or more of, by way of example, a general encapsulation material, an epoxy molding compound, and/or any suitable equivalents thereof. However, the present disclosure does not limit the material of the encapsulation part 120 to those listed herein.

In a representative embodiment of the present disclosure, the dielectric layer 130 may be formed on the semiconductor die 110 and the encapsulation part 120, and the redistribution layer 140 may pass through a part of the dielectric layer 130 to then be electrically connected to the semiconductor die 110. The dielectric layer 130 may comprise one or more dielectric layers, shown in the example of FIG. 1 as first to third dielectric layers 131, 132 and 133, and the redistribution layer 140 may comprise one or more redistribution layers, shown in FIG. 1 as first to third redistribution layers 141, 142 and 143.

The first dielectric layer 131 may be formed on the semiconductor die 110 and the encapsulation part 120. The first dielectric layer 131 may comprise one or more of, by way of example, a polyimide, an epoxy, a benzocyclobutane (BCB), a polybenzoxazole (PBO), and/or any suitable equivalents thereof. However, the present disclosure does not limit the material of the first dielectric layer 131 to those listed herein. Although not shown, the first dielectric layer 131 may be formed between the semiconductor die 110 and the encapsulation part 120 to reduce the effects of a difference in respective coefficients of thermal expansion between the semiconductor die 110 and the encapsulation part 120.

The first redistribution layer 141 may comprise a portion formed on a top surface of the first dielectric layer 131 by a predetermined length, and may comprise a portion passing through the first dielectric layer 131 and electrically connected to the metal pads 111 of the semiconductor die 110. The first redistribution layer 141 may comprise one or more of, by way of example, copper, aluminum, gold, silver, and/or any suitable equivalents thereof. However, the present disclosure does not limit the material of the first redistribution layer 141 to those listed herein.

In a representative embodiment of the present disclosure, the second dielectric layer 132 may be formed on the first dielectric layer 131, and may cover at least a portion of the first redistribution layer 141. The second dielectric layer 132 may comprise one or more of, by way of example, a polyimide, an epoxy, a benzocyclobutane (BCB), a polybenzoxazole (PBO), and/or any suitable equivalents thereof. However, the present disclosure does not limit the material of the second dielectric layer 132 to those listed herein.

The second redistribution layer 142 may comprise a portion formed on a top surface of the second dielectric layer 132 by a predetermined length, and may comprise a portion passing through the second dielectric layer 132 and electrically connected to the first redistribution layer 141. The second redistribution layer 142 may comprise one or more of, by way of example, copper, aluminum, gold, silver, and/or any suitable equivalents thereof. However, the present disclosure does not limit the material of the second redistribution layer 142 to those listed herein.

In a representative embodiment of the present disclosure, the third dielectric layer 133 may be formed on the second dielectric layer 132 and may cover at least a portion of the second redistribution layer 142. The third dielectric layer 133 may comprise one or more of, by way of example, a polyimide, an epoxy, a benzocyclobutane (BCB), a polybenzoxazole (PBO), and/or any suitable equivalents thereof. However, the present disclosure does not limit the material of the third dielectric layer 133 to those listed herein.

The third redistribution layer 143 shown in FIG. 1 may comprise a portion formed on the top surface of the first dielectric layer 131 by a predetermined length, and a portion passing through the first dielectric layer 131 and electrically connected to the conductive vias 160. As shown in FIG. 1, the conductive vias 160 may be formed in the encapsulation part 120, and portions of the third redistribution layer 143 that pass through the first dielectric layer 131 may be electrically connected to the conductive vias 160 through a portion of the third redistribution layer 143 formed on the encapsulation part 120 (e.g., directly or through a buffer layer 170 formed on the encapsulation part 120). The third redistribution layer 143 may comprise one or more of, for example, copper, aluminum, gold, silver, and/or any suitable equivalents thereof. However, the present disclosure does not limit the material of the third redistribution layer 143 to those listed herein.

As illustrated in FIG. 1, the solder balls 150 of the example semiconductor device 100 may extend through the third dielectric layer 133 and be electrically connected to the second redistribution layer 142 and/or first redistribution layer 141 (e.g., and/or the third redistribution layer 143, connection not illustrated), and a portion of the solder balls 150 may be exposed to the outside. The solder balls 150 (or other conductive balls) may comprise one or more of a tin/lead alloy, leadless tin, and/or any suitable equivalents thereof. However, the present disclosure does not limit the material of the solder balls 150 to those listed herein. Also for example, various examples may utilize other conductive structures like conductive pillars and/or plated structures instead of or in addition to the solder balls.

In a representative embodiment of the present disclosure, the conductive vias 160 may extend through the encapsulation part 120, from the bottom surface to the top surface of the encapsulation part 120, and may be electrically connected to the third redistribution layer 143 through the buffer layer 170. Each of the conductive vias 160 may, for example, be shaped substantially as a cylinder having a predetermined diameter that is preferably less than dimensions of the buffer layer 170 (e.g., less than a diameter of a circular buffer layer 170). The conductive vias 160 may, for example, be conical-shaped or may be shaped in any of a variety of alternative manners. The conductive vias 160 may comprise one or more of, for example, a tin/lead alloy, leadless tin, and/or any suitable equivalents thereof. However, the present disclosure does not limit the material of the conductive vias 160 to those listed herein.

The buffer layer 170 of the example of FIG. 1 may be formed on a top surface of the encapsulation part 120 and may electrically connect the third redistribution layer 143 to the conductive vias 160. In a representative embodiment of the present disclosure, one surface of the buffer layer 170 may make electrical contact with a portion of the third redistribution layer 143 passing through the first dielectric layer 131, and the other surface of the buffer layer 170 may make electrical contact with one side of each of the conductive vias 160 exposed to the top surface of the encapsulation part 120, thereby allowing the buffer layer 170 to electrically connect any or all of the conductive vias 160 to each other. Note that the buffer layer 170 or a portion thereof may also comprise respective electrically isolated portions corresponding to respective vias 160.—The buffer layer 170 may comprise one or more of, for example, copper, aluminum, gold, silver, and/or any suitable equivalents thereof. However, the present disclosure does not limit the material of the buffer layer 170 to those listed herein.

In a representative embodiment of the present disclosure, the buffer layer 170 may be shaped as a pad having a predetermined thickness T and a diameter R. For example, the buffer layer 170 may have a thickness T in a range of approximately 3 to 15 μm, and a diameter R in a range of approximately 25 to 500 μm. The thickness T and diameter R of the buffer layer 170 may be adjusted, for example, according to sizes of the conductive vias 160. The thickness T may, for example, be greater than a thickness of the metal pads 111 or may be the same or similar.

The formation of conductive vias in an encapsulation, such as the conductive vias 160 formed in the encapsulation part 120 of FIG. 1, may be performed using a laser. In a semiconductor device in which a structural element such as the buffer layer 170 of the present disclosure is not provided, an element such as the third redistribution layer 143 of FIG. 1 may be damaged due to high-temperatures generated in the course of forming the vias. In that instance, even if conductive vias are formed, the conductive vias and a structural element such as the third redistribution layer 143 of FIG. 1 might not be properly electrically connected to one another.

In a representative embodiment of the present disclosure, however, in which the buffer layer 170 is provided, damage to a structural element such as the third redistribution layer 143 of FIG. 1 due to the high-temperature heat (or other energy) generated in the course of forming vias is minimized, due to the increase in the thickness of a pertinent portion of the third redistribution layer 143 by the thickness T of the buffer layer 170. By employing a representative embodiment of the present disclosure, a more stable and reliable electrical connection between a structural elements such as the third redistribution layer 143 and the conductive vias 160 of FIG. 1, is achieved. Note that the buffer layer 170 may provide such protection no matter how the via 160 is formed (e.g., laser drilling, mechanical drilling, chemical drilling, etc.).

Next, a manufacturing method of a semiconductor device according to a representative embodiment of the present disclosure will be described.

Figure 2:
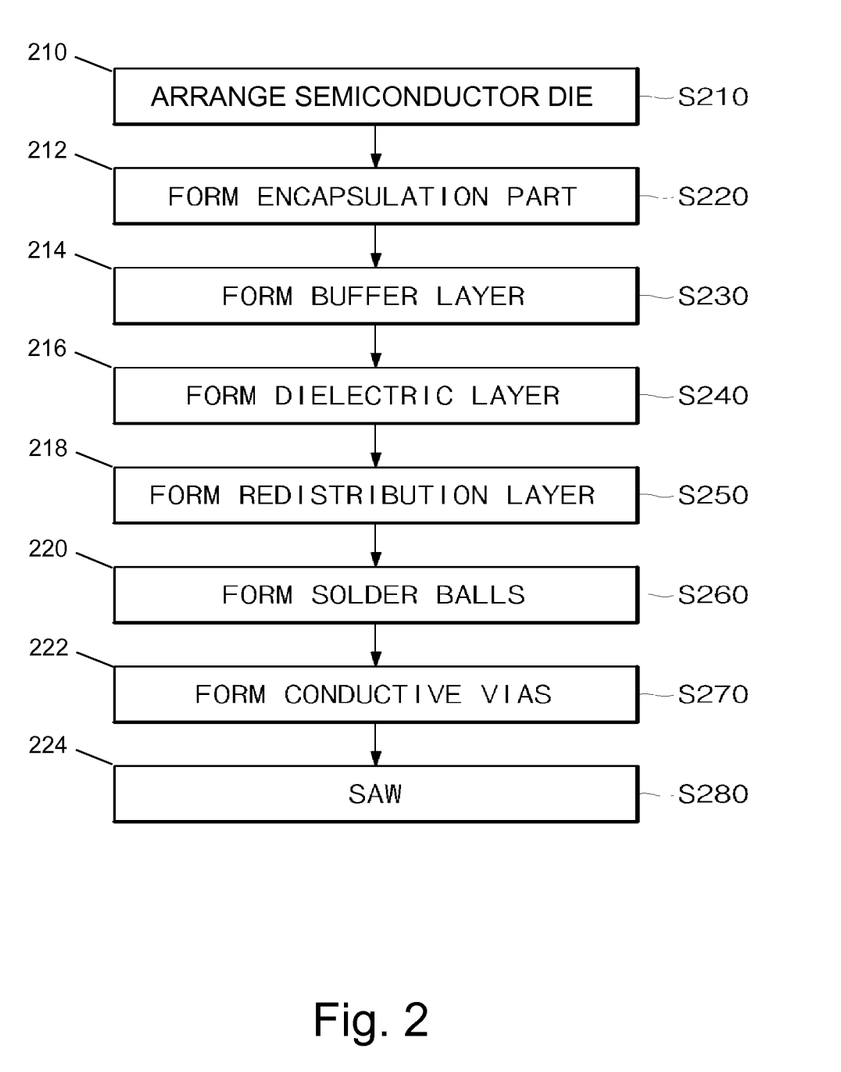
FIG. 2 is a flow chart illustrating a method of manufacturing a semiconductor device, in accordance with a representative embodiment of the present disclosure.

FIG. 2 is a flow chart illustrating an exemplary method of manufacturing a semiconductor device such as, for example, the semiconductor device 100 of FIG. 1, in accordance with a representative embodiment of the present disclosure.

As shown in the illustration of FIG. 2, the method of manufacturing a semiconductor device comprises steps of arranging semiconductor die 210 (S210), forming an encapsulation part 212 (S220), forming a dielectric layer 216 (S240), forming a redistribution layer 218 (S250), forming solder balls 220 (S260), and forming conductive vias 222 (S270). The example method of manufacturing a semiconductor device may further comprise the step of forming a buffer layer 214 (S230) between steps 212 (S220) and 216 (S240), and the step of sawing 224 (S280) after step 222 (S270).

FIGS. 3 to 17 sequentially illustrate example process steps of a method of manufacturing a semiconductor device, in accordance with the present disclosure.

Figure 3:
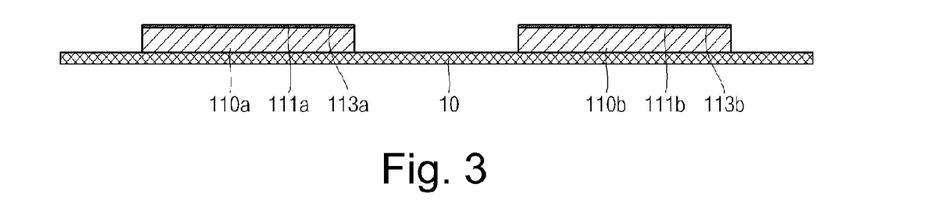
FIGS. 3 to 16 sequentially illustrate process steps of the method of manufacturing a semiconductor device as shown in FIG. 2, in accordance with a representative embodiment of the present disclosure.

Referring now to FIG. 3, corresponding to step 210 (S210) of FIG. 2, a plurality of semiconductor die 110a, 110b may be disposed on an insulation film 10. As illustrated in FIG. 3, the semiconductor die 110a, 110b may be horizontally arranged on a top surface of the insulation film 10 at a certain physical distance from one another. Accordingly, an empty space may be formed between the semiconductor die 110a, 110b. In accordance with the present disclosure, the insulation film 10 may have a top surface at least a portion of which is coated with an adhesive. Note that utilization of the insulation film is merely an example and that other die support structures (e.g., vacuum plates, plates with adhesive, wafers, etc.) may be used.

In accordance with the present disclosure, a plurality of metal pads 111a, 111b may be formed on the top surfaces of the semiconductor die 110a, 110b. In addition, die protection layers 113a, 113b for protecting the semiconductor die 110a, 110b may be formed on regions other than the regions where the metal pads 111a, 111b are formed. Such pads 111a, 111b and die protection layers 113a, 113b may, for example, generally coincide with the metal pads 111 and die protection layer 113 illustrated in FIG. 1. The plurality of metal pads 111a, 111b may be positioned on the top surfaces of the semiconductor die 110a, 110b so as to enable electrical connection to redistribution layers such as, for example, the redistribution layers 140a, 140b, discussed in further detail below with respect to FIG. 11 (and also, for example, shown by example as the redistribution layer 140 in FIG. 1). The metal pads 111a, 111b may comprise one or more of, for example, copper, aluminum, gold, silver, and/or any suitable equivalents thereof, and the die protection layers 113a, 113b may comprise, for example, a nitride or any suitable equivalent.

Figure 4:
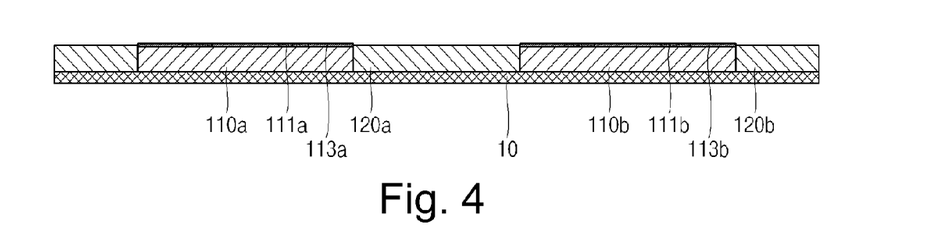

Referring now to FIG. 4, which corresponds to step 212 (S220) of FIG. 2, encapsulation parts 120a, 120b may be formed between the semiconductor die 110a, 110b. Each of the encapsulation parts 120a, 120b may be formed on lateral surfaces, that is, outer circumferential surfaces, of each of the semiconductor die 110a, 110b, and may be substantially in the shape of a plate. Top surfaces of the encapsulation parts 120a, 120b may be coplanar with the top surfaces of the semiconductor die 110a, 110b. In accordance with the present disclosure, the encapsulation parts 120a, 120b may be formed by transfer molding one or more of, by way of example and not limitation, a general encapsulation material, an epoxy molding compound, and/or any suitable equivalents thereof. The encapsulation parts 120a, 120b may, for example, generally coincide with the encapsulation part 120 illustrated in FIG. 1.

Figure 5:
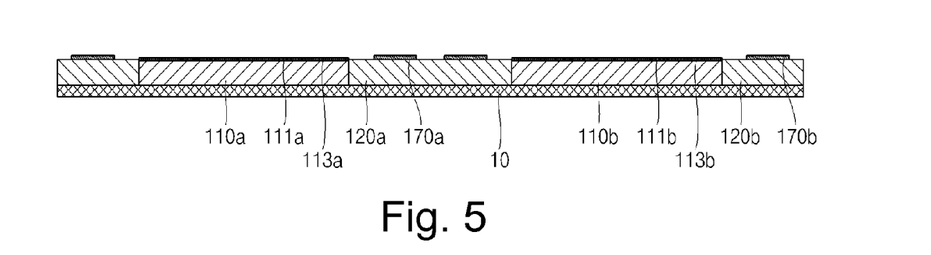

Referring now to FIG. 5, which corresponds to step 214 (S230) of FIG. 2, buffer layers 170a, 170b may be formed on the top surfaces of the encapsulation parts 120a, 120b. For example, what may be referred to herein as "seed layers" may be formed on the top surfaces of the encapsulation parts 120a, 120b using, for example, a metal material, such as titanium or tungsten, but not limited thereto, using, for example, electroless plating. In accordance with the present disclosure, the buffer layers 170a, 170b may be formed using one or more of copper, aluminum, gold, silver, and any suitable equivalents thereof. In various representative embodiments in accordance with the present disclosure, the positions and shapes of the buffer layers 170a, 170b may be adjusted using masks.

As previously mentioned above in the discussion of the buffer layers 170 of FIG. 1, buffer layers such as the buffer layers 170a, 170b may each be in the shape of a pad having a predetermined thickness T and a diameter R. For example, each of the buffer layers 170a, 170b may have a thickness T in a range of approximately 3 to 15 μm and a diameter R in a range of approximately 25 to 500 μm. The thickness T and diameter R of each of the buffer layers 170a, 170b may, for example, be adjusted according to sizes of the conductive vias 160a, 160b (to be formed later).

Figure 6:
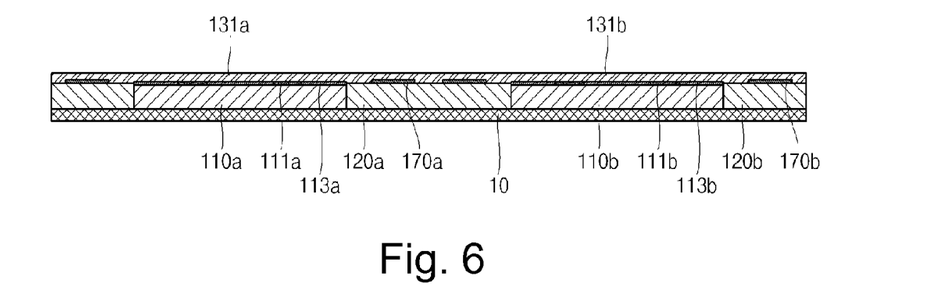

Referring now to FIG. 6, which corresponds to step 216 (S240) of FIG. 2, in step 216 (S240), in a representative embodiment according to the present disclosure, dielectric layers 130a, 130b, for example generally corresponding to the dielectric layers 130 of FIG. 1, may be formed on the semiconductor die 110a, 110b and the encapsulation parts 120a, 120b, respectively. In addition, in step 218 (S250), redistribution layers 140a, 140b, for example generally corresponding to the redistribution layers 140 of FIG. 1, which pass through parts of the dielectric layers 130a, 130b and are electrically connected to the semiconductor die 110a, 110b, respectively, may be formed.

In some representative embodiments in accordance with the present disclosure, steps 216 (S240) and 218 (S250)

may, together, comprise forming first dielectric layers, forming first redistribution layers, forming second dielectric layers, forming second redistribution layers, and forming third dielectric layers on each of the semiconductor die 110a, 110b.

In the forming of the first dielectric layers, as illustrated in FIG. 6, first dielectric layers 131a, 131b may be formed on the semiconductor die 110a, 110b and the encapsulation parts 120a and 120b, respectively. For example, the first dielectric layers 131a, 131b may be formed by coating, by way of example and not limitation, a polyimide, an epoxy, a benzocyclobutane (BCB), a polybenzoxazole (PBO), or any suitable equivalents thereof on the semiconductor die 110a, 110b. After the forming of the first dielectric layers, a soft cure process may be performed, thereby partially curing the first dielectric layers 131a, 131b.

Figure 7:
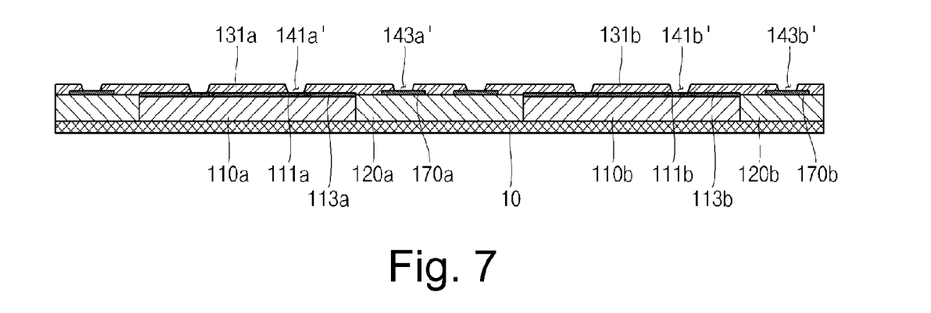
Figure 8:
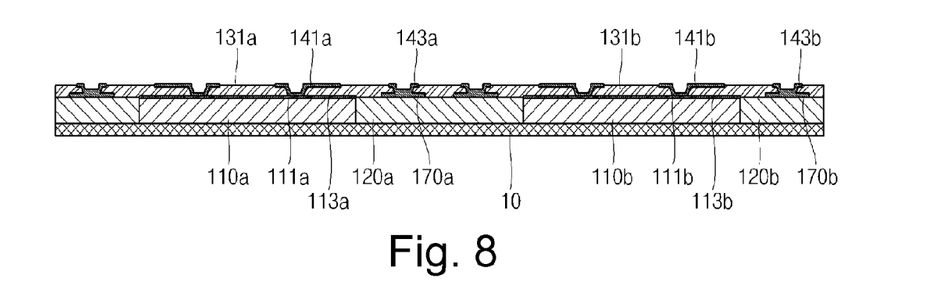

In the forming of the first redistribution layers, as illustrated in FIGS. 7 and 8, first redistribution layers 141a, 141b shown in FIG. 8 may be formed on top surfaces of the first dielectric layers 131a, 131b. The first redistribution layers 141a, 141b of FIG. 8 may extend through the first dielectric layers 131a, 131b and electrically connect to the metal pads 111a, 111b of the semiconductor die 110a, 110b, respectively. In a representative embodiment in accordance with the present disclosure, portions of regions of the first dielectric layers 131a, 131b, corresponding to the metal pads 111a, 111b of the semiconductor dies 110a, 110b, respectively, may, for example, be etched away, thereby forming first redistribution vias 141a', 141b', as illustrated in FIG. 7. The metal pads 111a, 111b may be exposed by the first redistribution vias 141a' and 141b'. Thereafter, what may be referred to herein as "seed" layers may be formed on potential regions of the first redistribution layers 141a, 141b of FIG. 8, using a metallic material such as, by way of example and not limitation, titanium or tungsten, and may be coated with one or more of copper, aluminum, gold, silver, and/or any suitable equivalents thereof using, for example, electroplating, thereby forming the first redistribution layers 141a, 141b, as illustrated in FIG. 8. In a representative embodiment in accordance with the present disclosure, the first redistribution layers 141a, 141b may be patterned using masks.

Figure 9:
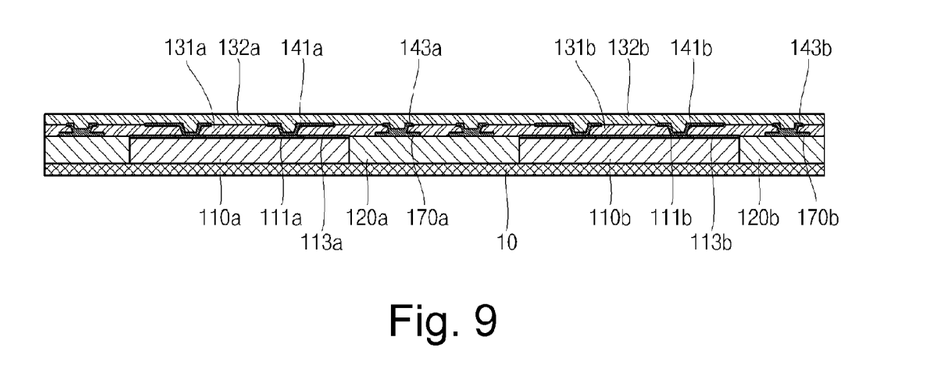

In the forming of the second dielectric layers, as illustrated in FIG. 9, second dielectric layers 132a, 132b may be formed on the first dielectric layers 131a, 131b so as to cover the first redistribution layers 141a, 141b. For example, the second dielectric layers 132a, 132b may be formed by coating, by way of example and not limitation, a polyimide, an epoxy, a benzocyclobutane (BCB), a polybenzoxazole (PBO), or any suitable equivalents thereof on the first dielectric layers 131a, 131b and on the first redistribution layers 141a, 141b. In addition, after the forming of the second dielectric layers, a soft cure process may be performed, thereby partially curing the second dielectric layers 132a, 132b.

Figure 10:
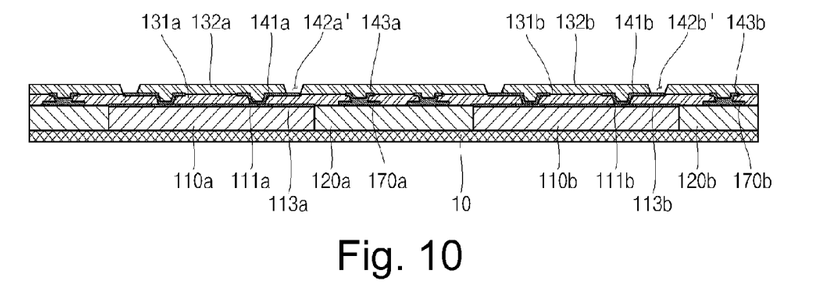
Figure 11:
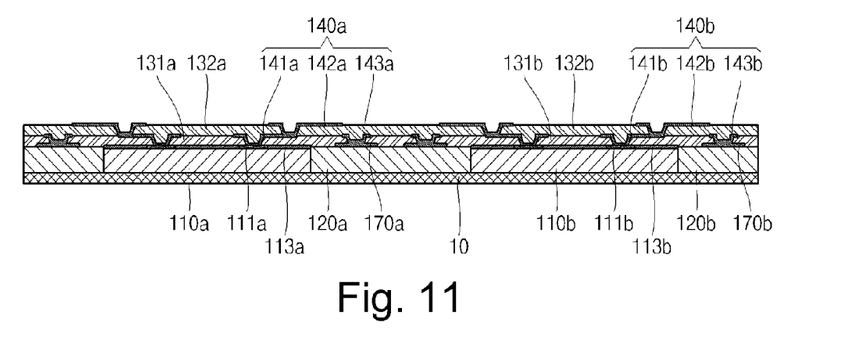

In the forming of the second redistribution layers, second redistribution layers 142a, 142b may be formed on the top surfaces of the second dielectric layers 132a, 132b, as shown in FIG. 11. The second redistribution layers 142a, 142b of FIG. 11 may extend through the second dielectric layers 132a, 132b and electrically connect to the first redistribution layers 141a, 141b. In a representative embodiment of the present disclosure, portions of regions of the second dielectric layers 132a, 132b corresponding to parts of the first redistribution layers 141a, 141b may be etched away, thereby forming second redistribution vias 142a', 142b', as illustrated in FIG. 10. In this manner, the parts of the second redistribution layers 141a, 141b may be exposed by the second redistribution vias 142a', 142b'. Thereafter, what may be referred to herein as "seed" layers may be formed on potential regions of the second redistribution layers 142a, 142b using a metallic material such as, by way of example and not limitation, titanium or tungsten, and coated with one or more of, for example, copper, aluminum, gold, silver and/or any suitable equivalents thereof using, for example, electroplating, thereby forming second redistribution layers 142a, 142b, as illustrated in FIG. 11. In a representative embodiment in accordance with the present disclosure, the second redistribution layers 142a, 142b may be patterned using masks.

Figure 12:
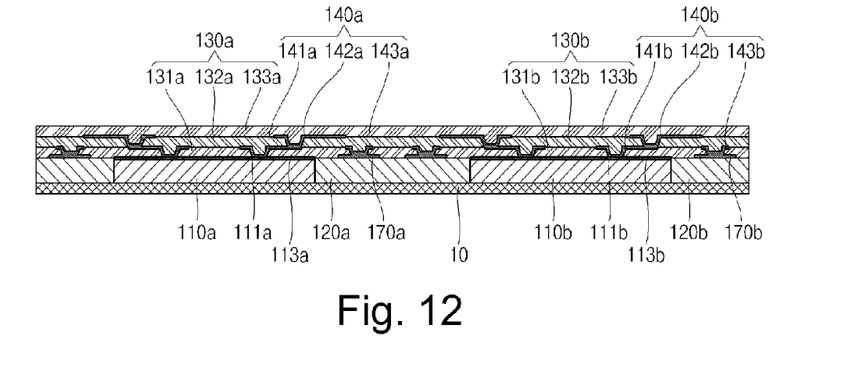

In the forming of the third dielectric layers 133a, 133b, as illustrated in FIG. 12, the third dielectric layers 133a, 133b may be formed on the second dielectric layers 132a, 132b so as to cover at least a portion of the second redistribution layers 142a, 142b. For example, the third dielectric layers 133a, 133b may be formed by coating a polyimide, an epoxy, a benzocyclobutane (BCB), a polybenzoxazole (PBO), or any suitable equivalents thereof on the second dielectric layers 132a, 132b and the second redistribution layers 142a, 142b. In addition, after the forming of the third dielectric layers, a soft cure process may be performed, thereby partially curing the third dielectric layers 133a, 133b.

Figure 13:
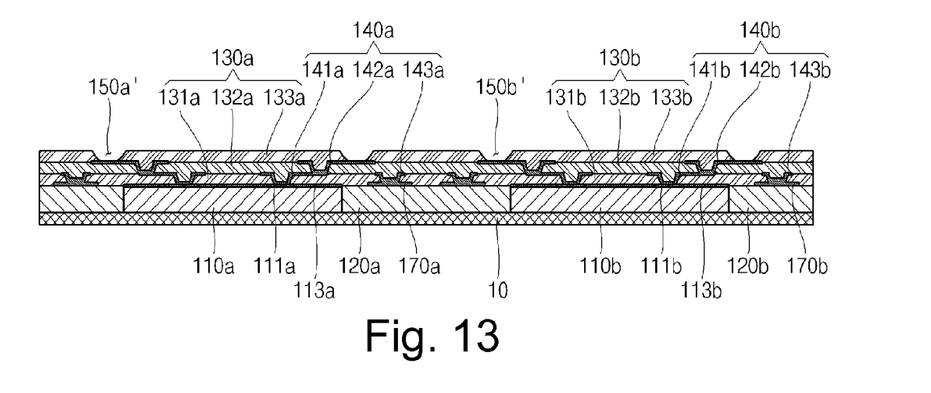
Figure 14:
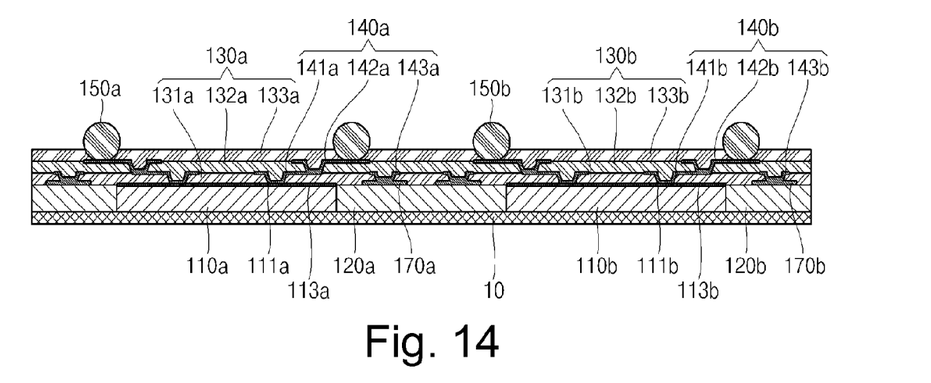

At step 220 (S260), as illustrated in FIG. 13, portions of regions of the third dielectric layers 133a, 133b, corresponding to portions of the second redistribution layers 142a, 142b positioned over the encapsulation parts 120a, 120b, may be etched away, thereby forming vias 150a', 150b' for the attachment of solder balls, as shown in FIG. 13. Accordingly, the second redistribution layers 142a, 142b are partially exposed by the vias 150a', 150b' for attachment of solder balls. The solder balls 150a, 150b may be dropped into the vias 150a', 150b', followed by a high-temperature reflow or other suitable attachment process, thereby connecting the second redistribution layers 142a, 142b to the solder balls 150a, 150b, respectively, as illustrated in FIG. 14. The solder balls 150a, 150b may be formed using one or more of, by way of example and not limitation, a tin/lead alloy, leadless tin, and/or any suitable equivalents thereof.

Figure 15:
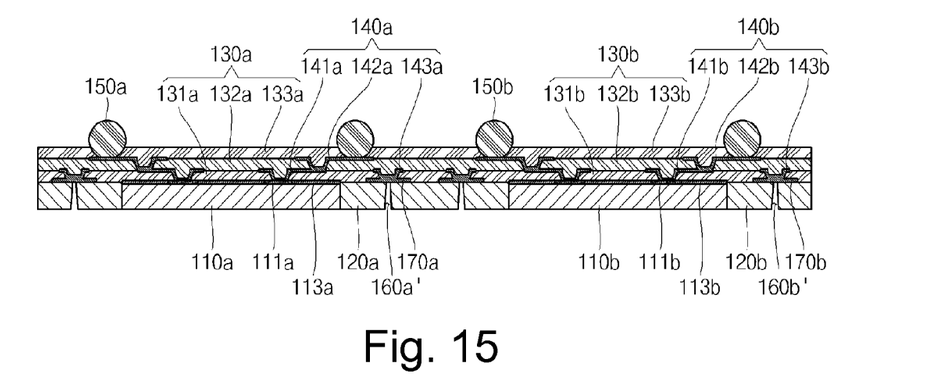
Figure 16:
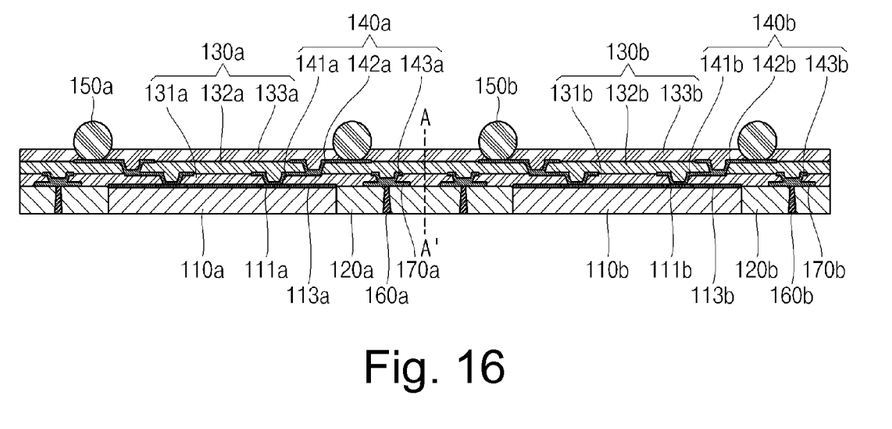

At step 222 (S270), the insulation film 10 attached to bottom surfaces of the semiconductor die 110a, 110b and the encapsulation parts 120a, 120b may be removed, to enable the formation of vias 160a', 160b' through the encapsulation parts 120a, 120b, as illustrated in FIG. 15. In a representative embodiment of the present disclosure, the vias 160a', 160b' may be formed by etching portions of the encapsulation parts 120a, 120b corresponding to the buffer layers 170a, 170b using, for example, a laser etching (or drilling) process. Following creation of the vias 160a', 160b', the vias 160a', 160b' may be filled using one or more of a tin/lead alloy, leadless tin, and/or any suitable equivalents thereof, thereby forming the conductive vias 160a, 160b shown in FIG. 16. The vias 160a, 160b may, for example, generally correspond to the conductive vias 160 illustrated in FIG. 1. The conductive vias 160a, 160b shown in FIG. 16 are then in electrical contact with the third redistribution layers 143a, 143b through the buffer layers 170a, 170b. In some representative embodiments in accordance with the present disclosure, the conductive vias 160a, 160b may directly electrically contact the third redistribution layers 143a, 143b.

As discussed above, alternative approaches to forming conductive vias such as the conductive vias 160a in the encapsulation materials such as encapsulation parts 120a and 120b may use a laser. In approaches in which buffer layers such as the buffers layers 170a, 170b of the present disclosure are not provided, elements of the semiconductor device such as the third redistribution layer layers 143a, 143b may be prone to damage due to the high-temperature heat generated in the course of forming the vias. In such a case, even if the conductive vias such as the conductive vias 160a, 160b are formed, elements of the semiconductor device such as the conductive vias 160a, 160b and the third redistribution layers 143a, 143b might not be properly electrically connected to each other. By employing buffer layers of the present disclosure, such as the buffers layers 170a, 170b of FIG. 16, such damage due to high-temperature heat generated in the course of forming the vias may be avoided.

However, like in the embodiment of the present disclosure, when the buffer layers 170a, 170b are provided, as the thickness of each of pertinent portions of the third redistribution layers 143a, 143b is increased by the thickness T of each of the buffer layers 170a, 170b, it is possible to minimize damages occurring to the third redistribution layers 143a, 143b due to the high-temperature heat (or other energy) generated in the course of forming vias. Accordingly, more stably electrical connection between the third redistribution layers 143a, 143b and the conductive vias 160a, 160b can be achieved.

At step 224 (S280), the dielectric layers 130a, 130b and the encapsulation parts 120a, 120b are subjected to sawing along the line A-A' of FIG. 16, thereby obtaining discrete semiconductor devices assembled to incorporate the semiconductor die 110a, 110b of FIGS. 3-16.

This disclosure provides exemplary embodiments of the present disclosure. The scope of the present disclosure is not limited by these exemplary embodiments. Numerous variations, whether explicitly provided for by the specification or implied by the specification, such as variations in structure, dimension, type of material and manufacturing process, may be implemented by one skilled in the art in view of this disclosure.

The present disclosure addresses the above-described drawbacks by providing a semiconductor device having a stably-formed structure capable of being electrically connected to a separate semiconductor device without causing damage to a redistribution layer, and a manufacturing method thereof.

In accordance with an aspect of the present disclosure, there is provided a semiconductor device comprising a semiconductor die, an encapsulation part formed on lateral surfaces of the semiconductor die, a dielectric layer formed on the semiconductor die and the encapsulation part, a redistribution layer passing through a part of the dielectric layer and electrically connected to the semiconductor die, solder balls passing through other parts of the dielectric layer and electrically connected to the redistribution layer and exposed to the outside, and conductive vias passing through the encapsulation part and electrically connected to the redistribution layer.

The semiconductor device may further comprise a buffer layer electrically connecting the redistribution layer and the conductive vias to each other. The buffer layer may have a thickness in a range of 3 to 15 µm, and the buffer layer may have a diameter in a range of 25 to 500 µm. The dielectric layer may comprise a first dielectric layer formed on the semiconductor die and the encapsulation part; a second dielectric layer formed on the first dielectric layer; and a third dielectric layer formed on the second dielectric layer. The redistribution layer may comprise a first redistribution layer formed on a top surface of the first dielectric layer and passing through the first dielectric layer to be electrically connected to the semiconductor die; a second redistribution layer formed on a top surface of the second dielectric layer and passing through the second dielectric layer to be electrically connected to the first redistribution layer; and a third redistribution layer formed on a top surface of the first dielectric layer to be electrically connected to the first redistribution layer and passing through the first dielectric layer to be electrically connected to the conductive vias. The third dielectric layer may cover the second redistribution layer. The solder balls may pass through the third dielectric layer and be electrically connected to the second redistribution layer.

In accordance with an aspect of the present disclosure, there is provided a manufacturing method of a semiconductor device, the method comprising arranging a plurality of semiconductor dies on an insulation film at a constant interval; forming an encapsulation part between the semiconductor dies; forming a dielectric layer on the semiconductor dies and the encapsulation part; forming a redistribution layer passing through a part of the dielectric layer and electrically connected to the semiconductor dies; forming solder balls passing through other parts of the dielectric layer and electrically connected to the redistribution layer to then be exposed to the outside; and forming conductive vias passing through the encapsulation part and electrically connected to the redistribution layer. Between the forming of the encapsulation part and the forming of the dielectric layer, the manufacturing method may further comprise forming a buffer layer on a top surface of the encapsulation part. The buffer layer may be formed to electrically connect the redistribution layer and the conductive vias to each other. The buffer layer may have a thickness in a range of 3 to 15 µm, and the buffer layer may have a diameter in a range of 25 to 500 µm. After the forming of the conductive vias, the manufacturing method may further comprise sawing the dielectric layer and the encapsulation part to be diced into discrete semiconductor devices.

The forming of the dielectric layer and the forming of the redistribution layer may comprise forming a first dielectric layer on the semiconductor dies and the encapsulation part; forming a first redistribution layer formed on a top surface of the first dielectric layer and passing through the first dielectric layer to be electrically connected to the semiconductor dies; forming a second dielectric layer on the first dielectric layer to cover the first redistribution layer; forming a second redistribution layer formed on a top surface of the second dielectric layer and passing through the second dielectric layer to be electrically connected to the first redistribution layer; and forming a third dielectric layer on the second dielectric layer to cover the second redistribution layer.

As described above, the present disclosure provides a semiconductor device having a stably formed structure capable of being electrically connected to a separate semiconductor device without causing damages to a redistribution layer, and a manufacturing method thereof.

Aspects of the present disclosure may be seen in a semiconductor device comprising a semiconductor die comprising a first face, a second face opposite the first face, and one or more lateral surfaces connecting the first face and the second face; an encapsulation part formed on the lateral surfaces of the semiconductor die; and a dielectric layer formed on the first face of the semiconductor die and on the encapsulation part. The semiconductor device may also comprise an electrically conductive redistribution layer extending through at least a part of the dielectric layer and electrically connected to the first face of the semiconductor die; one or more conductive balls extending through the dielectric layer, the one or more conductive balls electrically connected to the redistribution layer and exposed to an environment outside of the semiconductor device; and one or more conductive vias extending through the encapsulation part and electrically connected to the redistribution layer. The semiconductor device may further comprise a buffer layer electrically connecting the redistribution layer and the conductive vias to each other.

In a semiconductor device in accordance with the present disclosure, the buffer layer may have a thickness in a range of 3 to 15 μm, and the buffer layer may have a diameter in a range of 25 to 500 μm. The dielectric layer may comprise a first dielectric layer formed on the semiconductor die and on the encapsulation part, a second dielectric layer formed on the first dielectric layer; and a third dielectric layer formed on the second dielectric layer. The redistribution layer may comprise a first redistribution layer formed on a top surface of the first dielectric layer and extending through the first dielectric layer to electrically connect to the semiconductor die, and a second redistribution layer formed on a top surface of the second dielectric layer and extending through the second dielectric layer to electrically connect to the first redistribution layer. The redistribution layer may also comprise a third redistribution layer formed on a top surface of the first dielectric layer to electrically connect to the second redistribution layer and to the one or more conductive vias. The third dielectric layer may cover at least a portion of the second redistribution layer. In a representative embodiment in accordance with the present disclosure, the conductive balls may extend through the third dielectric layer and may be electrically connected to the second redistribution layer.

Additional aspects of the present disclosure may be observed in a method of manufacturing a semiconductor device. Such a method may comprise arranging a plurality of semiconductor die on a die support structure, the semiconductor die spaced from one another, forming an encapsulation part between the semiconductor die, and forming a dielectric layer on the plurality of semiconductor die and the encapsulation part. The method may also comprise forming a redistribution layer that extends through parts of the dielectric layer to electrically connect a portion of the redistribution layer to a corresponding one of the plurality of semiconductor die, and forming one or more conducive balls that are exposed to an environment outside of the semiconductor device and that extend through other parts of the dielectric layer to electrically connect to the redistribution layer. The method may also comprise forming one or more conductive vias that extend through the encapsulation part and that are electrically connected to the redistribution layer. The method may further comprise, after said forming the encapsulation part and before said forming of the dielectric layer, forming a buffer layer on a top surface of the encapsulation part, and the formed buffer layer may electrically connect the redistribution layer and the conductive vias to each other. The buffer layer may have a thickness in a range of 3 to 15 μm, and the buffer layer may have a diameter in a range of 25 to 500 μm. The method may further comprise, after said forming of the conductive vias, sawing the dielectric layer and the encapsulation part to produce a plurality of discrete semiconductor devices.

In a representative embodiment of the present disclosure, said forming the dielectric layer and said forming the redistribution layer may comprise forming a first dielectric layer on the semiconductor die and the encapsulation part; and forming a first redistribution layer formed on a top surface of the first dielectric layer, the first redistribution layer extending through the first dielectric layer and electrically connecting to the semiconductor die. The method may also comprise forming a second dielectric layer on the first dielectric layer to cover at least a portion of the first redistribution layer; forming a second redistribution layer on a top surface of the second dielectric layer, the second redistribution layer extending through the second dielectric layer and electrically connecting to the first redistribution layer; and forming a third dielectric layer on the second dielectric layer to cover at least a portion of the second redistribution layer. A distance between the semiconductor die on the die support structure may be constant.

Further aspects of the present disclosure may be found in a method of manufacturing a semiconductor device, where the method comprises arranging a plurality of semiconductor die on a die support structure, the semiconductor die spaced from one another; forming an encapsulation part between the semiconductor die; after forming the encapsulation part, forming a buffer layer on a top surface of the encapsulation part; and after forming the buffer layer, forming a dielectric layer on the plurality of semiconductor die, the encapsulation part, and the buffer layer. The method may also comprise, after forming the dielectric layer, forming a redistribution layer that extends through parts of the dielectric layer to electrically connect to portion of the redistribution layer to a corresponding one of the plurality of semiconductor die; and forming one or more conductive vias that extend through the encapsulation part and that are electrically connected to the redistribution layer by the buffer layer. The buffer layer may have a thickness in a range of 3 to 15 μm, and the method may further comprise, after said forming of the conductive vias, sawing the dielectric layer and the encapsulation part to produce a plurality of discrete semiconductor devices. A distance between the semiconductor die on the die support structure may be constant.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A semiconductor device comprising:
   a semiconductor die comprising a first face, a second face opposite the first face, and one or more lateral surfaces connecting the first face and the second face;
   an encapsulation part on the lateral surfaces of the semiconductor die, the encapsulation part comprising a first surface and a second surface opposite the first surface, wherein the encapsulation part directly contacts the one or more lateral surfaces of the semiconductor die;
   one or more electrically conductive buffer layer portions directly contacting the first surface of the encapsulation part;
   a dielectric layer on the first face of the semiconductor die and on the first surface of the encapsulation part;

an electrically conductive layer extending through at least a part of the dielectric layer and electrically connected to the first face of the semiconductor die;

one or more conductive balls extending through the dielectric layer, the one or more conductive balls electrically connected to the conductive layer and exposed to an environment outside of the semiconductor device; and one or more conductive vias each having a respective first end surface on a respective portion of the one or more electrically conductive buffer layer portions and extending through the encapsulation part to a respective second end surface exposed to the outside of the semiconductor device at the second surface of the encapsulation part, the one or more conductive vias electrically connected to the conductive layer.

2. The semiconductor device of claim 1, wherein the one or more electrically conductive buffer layer portions comprise a first surface and a second surface opposite the first surface, where at least a portion of the first surface contacts the encapsulation part and at least a portion of the second surface contacts the dielectric layer, and wherein the one or more electrically conductive buffer layer portions electrically connect the conductive layer and the conductive vias to each other.

3. The semiconductor device of claim 2, wherein each of the one or more electrically conductive buffer layer portions has a thickness in a range of 3 to 15 µm and a diameter in a range of 25 to 500 µm.

4. The semiconductor device of claim 1, wherein the dielectric layer comprises:
a first dielectric layer on the semiconductor die and on the encapsulation part;
a second dielectric layer on the first dielectric layer; and
a third dielectric layer on the second dielectric layer.

5. The semiconductor device of claim 4, wherein the conductive layer comprises:
a first conductive layer on a top surface of the first dielectric layer and extending through the first dielectric layer to electrically connect to the semiconductor die;
a second conductive layer on a top surface of the second dielectric layer and extending through the second dielectric layer to electrically connect to the first conductive layer; and
a third conductive layer on a top surface of the first dielectric layer to electrically connect to the second conductive layer and to the one or more conductive vias.

6. The semiconductor device of claim 5, wherein the third dielectric layer covers at least a portion of the second conductive layer.

7. The semiconductor device of claim 5, wherein the conductive balls extend through the third dielectric layer and are electrically connected to the second conductive layer.

8. A semiconductor device comprising:
a semiconductor die comprising a first face, a second face opposite the first face, and one or more lateral surfaces connecting the first face and the second face;
an encapsulation part on the lateral surfaces of the semiconductor die, the encapsulation part comprising a first surface and a second surface opposite the first surface, wherein the encapsulation part directly contacts the one or more lateral surfaces of the semiconductor die;
an electrically conductive buffer layer directly contacting the first surface of the encapsulation part;
a dielectric layer on the first face of the semiconductor die and on the first surface of the encapsulation part, the dielectric layer covering the buffer layer;
one or more conductive vias each having a respective first end surface on a respective portion of the electrically conductive buffer layer and extending from the first surface of the encapsulation part to a respective second end surface exposed to the outside of the semiconductor device at the second surface of the encapsulation part; and
an electrically conductive layer extending through at least a part of the dielectric layer and electrically connected to the first face of the semiconductor die and the conductive layer electrically connected by the buffer layer to the one or more conductive vias.

9. The semiconductor device of claim 8, further comprising one or more conductive balls extending through the dielectric layer, the one or more conductive balls electrically connected to the conductive layer and exposed to an environment outside of the semiconductor device.

10. The semiconductor device of claim 8, wherein the buffer layer has a thickness in a range of 3 to 15 µm and a diameter in a range of 25 to 500 µm.

11. The semiconductor device of claim 8, wherein the buffer layer comprises one or more portions that are electrically isolated from remaining portions of the buffer layer, each of the electrically isolated portions being connected at the top surface of the encapsulation part to a respective conductive via of the one or more conductive vias.

12. The semiconductor device of claim 8, wherein the dielectric layer comprises:
a first dielectric layer on the semiconductor die and on the first surface of the encapsulation part;
a second dielectric layer on the first dielectric layer; and
a third dielectric layer on the second dielectric layer.

13. The semiconductor device of claim 12, wherein the conductive layer comprises:
a first conductive layer on a top surface of the first dielectric layer and extending through the first dielectric layer to electrically connect to the semiconductor die;
a second conductive layer on a top surface of the second dielectric layer and extending through the second dielectric layer to electrically connect to the first conductive layer; and
a third conductive layer on a top surface of the first dielectric layer to electrically connect to the second conductive layer and to the one or more conductive vias.

14. A semiconductor device comprising:
a semiconductor die comprising a first face, a second face opposite the first face, and one or more lateral surfaces connecting the first face and the second face;
an encapsulation part on the lateral surfaces of the semiconductor die, the encapsulation part comprising a first surface and a second surface opposite the first surface, wherein the encapsulation part directly contacts the one or more lateral surfaces of the semiconductor die;
one or more electrically conductive buffer layer portions directly contacting the first surface of the encapsulation part;
a dielectric layer on the first face of the semiconductor die and on the first surface of the encapsulation part, the dielectric layer covering a part of each portion of the buffer layer;
one or more conductive vias each having a respective first end surface on a respective portion of the one or more electrically conductive buffer layer portions and extending through the encapsulation part to a respective second end surface exposed to the outside of the semiconductor device at the second surface of the encapsulation part; and an electrically conductive layer extending through at least a part of the dielectric layer and electrically connected to the first face of the semiconductor die, the conductive layer electrically connected by the one or more buffer layer portions to the respective conductive vias.

15. The semiconductor device of claim 14, further comprising one or more conductive balls on and electrically connected to the conductive layer, the one or more conductive balls exposed to an environment outside of the semiconductor device through the dielectric layer.

16. The semiconductor device of claim 14, wherein the one or more portions of the buffer layer have a thickness in a range of 3 to 15 µm and a diameter in a range of 25 to 500 µm and larger than a cross section of the respective conductive via.

17. The semiconductor device of claim 14, wherein the one or more portions of the buffer layer are electrically interconnected.

* * * * *